United States Patent [19]

Lennon et al.

[11] 4,105,966
[45] Aug. 8, 1978

[54] REMOTE LIGHTNING MONITOR SYSTEM

[75] Inventors: Carl L. Lennon; Thomas O. Britt, both of Merritt Island, Fla.

[73] Assignee: The United States of America as represented by the Administrator of the National Aeronautics and Space Administration, Washington, D.C.

[21] Appl. No.: 782,482

[22] Filed: Mar. 29, 1977

[51] Int. Cl.² .................... G01R 13/04; G01R 19/16
[52] U.S. Cl. .................................. 324/113; 324/102; 324/133
[58] Field of Search ............... 324/113, 112, 102, 133, 324/96; 340/253 P

[56] References Cited

U.S. PATENT DOCUMENTS

| 2,537,384 | 1/1951 | Waghorne | 324/102 |
| 3,506,833 | 4/1970 | vonWillisen | 324/96 |
| 3,662,380 | 5/1972 | Cargile | 324/112 |

Primary Examiner—Rudolph V. Rolinec
Assistant Examiner—Ernest F. Karlsen
Attorney, Agent, or Firm—James O. Harrell; John R. Manning

[57] ABSTRACT

An apparatus for monitoring, analyzing and accurately determining the value of peak current, the peak rate of change in current with respect to time and the rise time of the electrical currents generated in an electrical conductive mast that is located in the vicinity where lightning is to be monitored. The apparatus includes an electrical coil for sensing the change in current flowing through the mast and generating a voltage responsive thereto. An on-site recorder and a recorder control system records the voltages produced responsive to lightning strikes and converts the voltage to digital signals for being transmitted back to the remote command station responsive to command signals. The recorder and the recorder control system are carried within an RFI proof environmental housing into which the command signals are fed by means of a fiber optic cable so as to minimize electrical interference.

6 Claims, 4 Drawing Figures 4,105,966

REMOTE LIGHTNING MONITOR SYSTEM

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The present invention relates to a remote lightning monitoring system, and more particularly to a lightning monitoring system wherein instruments located in the vincinity wherein the lightning is being monitored are carried within radio frequency interference (RFI) proof environmental housings so as to minimize electrical interference.

It has become very important, particularly in the space industry, to monitor lightning strikes so as to determine the characteristics and intensity of such at all times. This is particularly important in environments wherein sensitive instruments and equipment are being utilized which may be damaged by lightning strikes exceeding certain intensities. It is also possible that certain transient voltages may damage or destroy information that is stored in computers and various control equipment.

Techniques used in the past to measure currents and voltages produced by lightning strikes are very limited since the feedback information concerning the data is too slow, inaccurate and insufficient. Hours or even days often elapse before data is made available to help evaluate the damages caused by lightning strikes. The reason for such delay is that the instrumentation requires manual read/reset, which takes many man hours to collect and accumulate. In addition, hazardous conditions sometimes delay access to the instrumentation area and thus delays the reading of the meters. Very often the instrumentation gives an erroneous reading because of the inneracting interference from intense electric and magnetic fields that are normally associated with lightning. Some of the instrumentation is too slow in responding and thus fails to capture the true value of the lightning strike data. Power failure often causes complete failure of the measurement instrumentation.

SUMMARY OF THE INVENTION

The invention includes an apparatus for monitoring lightning strikes so as to determine if the current generated by the lightning strikes exceeds a predetermined value. The apparatus includes an electrically conductive elongated member which extends downwardly from a device such as a space vehicle launch pad where the lightning strikes are being monitored. Electrical currents are generated in the elongated member proportional to the intensity of the lightning strikes. A sensing coil is used for sensing the change in current in the elongated member and generating a voltage proportional thereto. This voltage is fed into an on-site recorder means which converts the voltage into digital signals. An RFI proof environmental housing encloses the recorder means and a recorder control system for electrically isolating the equipment. A remotely located control computer is provided for sending command signals to and from the on-site recorder and recorder control system. Cables extend from the control computer over which the command signals are transmitted. A fiber optic cable extends between the electrical cables and into the housing for isolating the instrumentation located therein. The system also calls for means for transmitting the command signals to the remotely located transient recorder system for causing the recorder means to record the digital information and means for transmitting information from the on-site location back to the remotely located control means representing the change in current produced by the lightning strikes. Thus, by enclosing the recorder control system and the recorder within the housing, and providing communication therewith from a control computer through optical electrical interface, electrical isolation is thereby provided.

Accordingly it is an important object of the present invention to provide an apparatus which monitors lightning strikes.

Another important object of the present invention is to provide an apparatus for monitoring lightning strikes which can be automatically controlled from a remote location.

Still another important object of the present invention is to provide an apparatus for monitoring lightning strikes wherein data transmission operations may be transmitted to and from an enclosed housing through a fiber optic medium.

Still another important object of the present invention is to provide an apparatus for monitoring lightning strikes wherein remote control and data communications are transmitted and received by means of light wave propagated through fiber optic mediums.

Still another important object of the present invention is to provide an apparatus for monitoring lightning strikes wherein measuring devices are located within an RFI protected environmental enclosure and the information pertaining to the strikes is transmitted to a remote station located approximately fourteen miles away.

These and other objects and advantages of the invention will become apparent upon reference to the following specification, attendant claims and drawings.

DESCRIPTION OF A PREFERRED EMBODIMENT

It has become very important in the space industry to monitor lightning strikes, and in particular in the vicinity of space vehicle launch pads. It has also become very important to isolate these launch pads from lightning strikes. This is normally accomplished by utilizing a pair of cables which extend downwardly from the top of the gantry on the launch pad to ground. If lightning strikes in the vicinity, a current proportional to the intensity of the strike is generated in these cables. It has been found that by measuring the flow of current through these cables and converting such to voltages accurate graphs of the voltage and intensity of the lightning strike may be reproduced.

Figure 1:
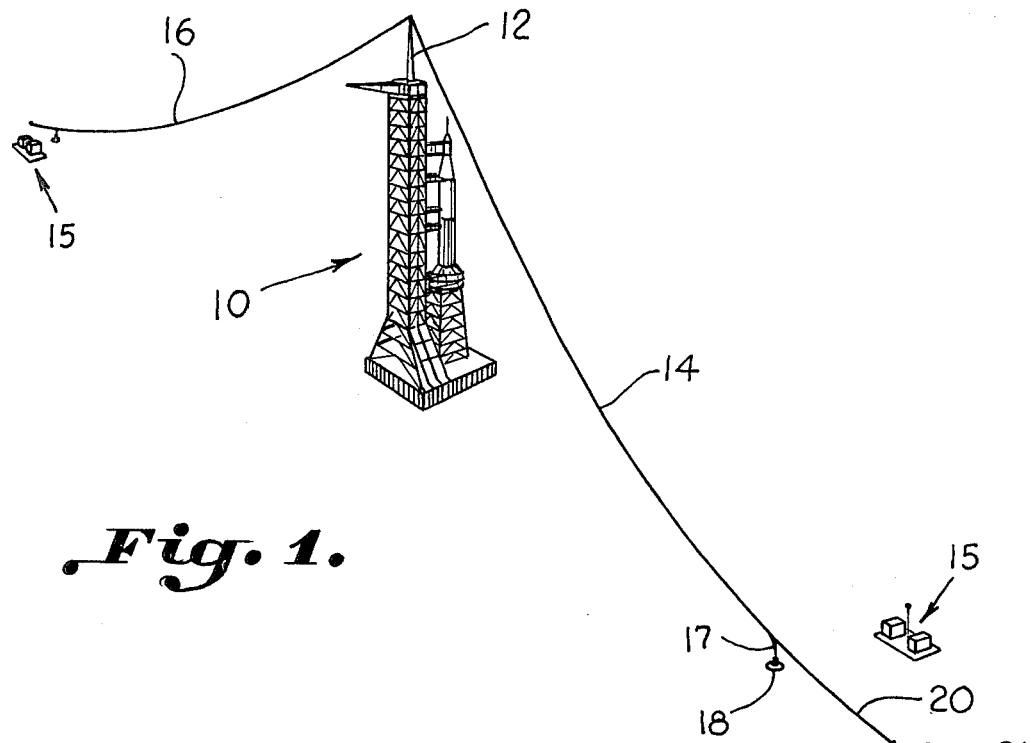
FIG. 1 is a perspective view illustrating a launch platform equipped with cables forming part of the apparatus constructed in accordance with the present invention for monitoring lightning strikes.

Referring in more detail to FIG. 1 of the drawing, there is illustrated a conventional space vehicle launch pad generally designated by the reference character 10 having an insulated mast 12 mounted on the top of the gantry thereof. Extending downwardly from the mast 12 are lightning arresting cables 14 and 16 which are provided for minimizing the effect of lightning or isolating the gantry and launch pad from strikes of lightning. Normally, if lightning strikes in the vicinity, these cables 14 and 16 will receive the full impact of the lightning strike. When the lightning strikes, current is generated within the cables 14 and 16 and flows downwardly through the cable to a mast 17 which has its lower end grounded as at 18. The voltage generated by the lightning strikes is fed into on-site recorder means designated generally by reference character 15 in FIG. 1. There is an insulated strip (not shown) within the cable between the top of the mast 17 and a conventional anchor 21 through which the cable is fastened to the ground. Therefore, current does not flow through that portion of the cable identified in FIG. 1 by the reference charcter 20, but instead flows through the mast 17 to ground 18.

When the lightning strikes, current is produced in the mast 17. This current flowing through the mast 17 to ground produces a changing magnetic field which, in turn, induces a voltage in a coil 22 (see FIG. 2) which surrounds the mast. This coil may be any suitable conventional coil and in one particular embodiment a Kirkland coil is utilized. The coil has a one nanosecond rise time and the voltage induced therein is proportional to dI/dT. The voltage produced by the coil 22 is fed through a shielded cable 24 to the on-site recorder means 15 having an attenuator 26 which attenuates the signal so that such can be conveniently handled by equipment while preventing such from being damaged by excessive voltages produced.

Figure 2:
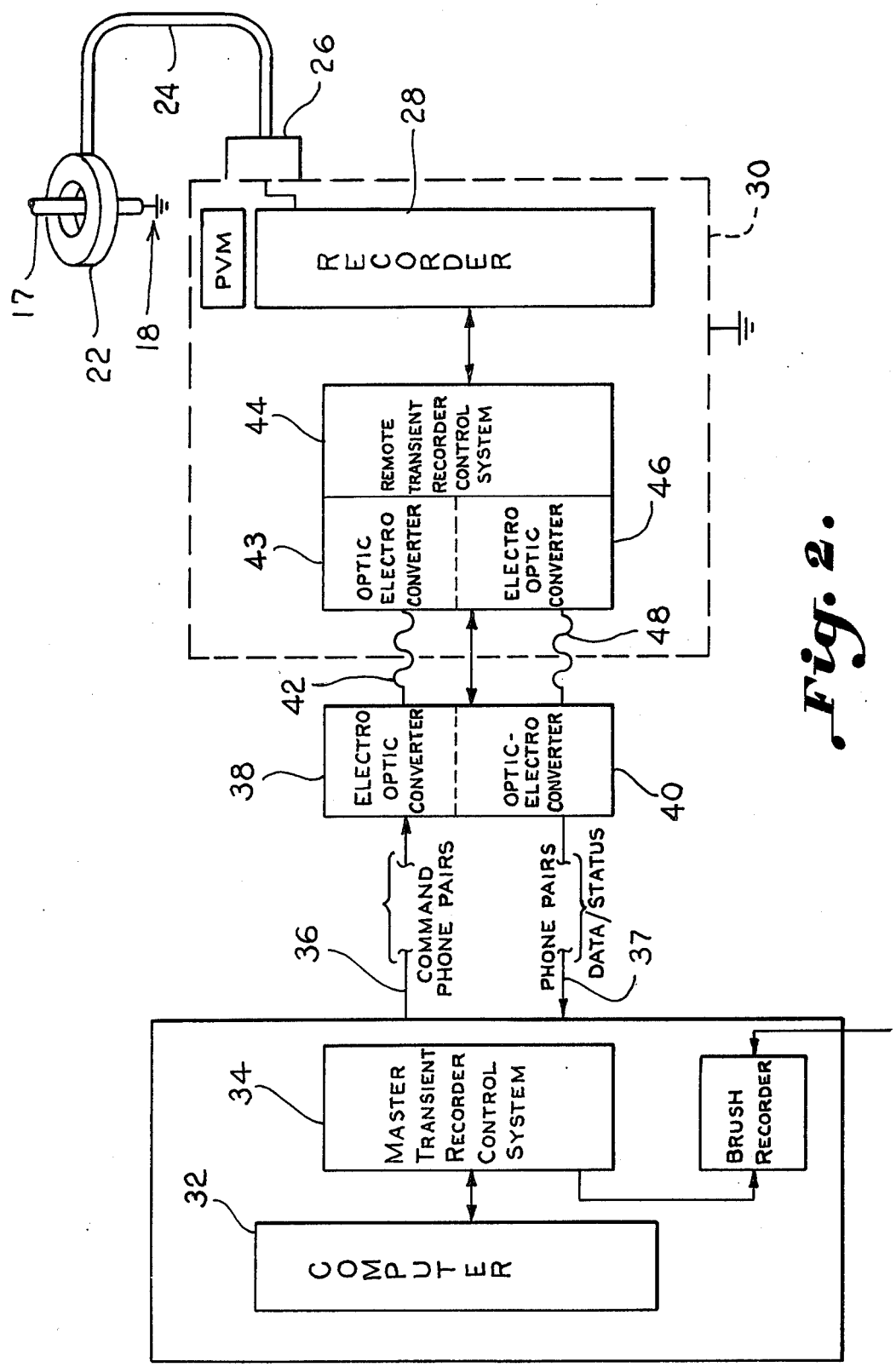
FIG. 2 is a schematic diagram in block form illustrating the apparatus constructed in accordance with the present invention.

As illustrated in FIG. 2, the attenuator 26, in turn, feeds the signals to a transient recorder 28 carried within a shielded environmental enclosure 30 which protects the recorder from radio frequency inteference.

A remotely located control means is provided for generating command signals for controlling, storing and tramitting of the information to and from the transient recorder 28. This control means includes a computer 32 located at the remote site which in this case may be fourteen miles from the on-site measurement instrumentation such as enclosed in the environmental enclosure 30. The purpose of the computer 32 is to generate command signals for controlling the transmission and activation of the instruments at the on-site location. The computer 32 is connected through a master transient recorder control system 34 to a pair of telephone cables 36 and 37 which may extend for approximately fourteen miles. The far end of the cable 36 is connected to an electro optical converter 38 which converts the electrical signals into optic signals. Similarly, an optic electrol converter 40 is provided for converting optical signals back into electrical signals to be fed back to the computer by means of telephone line 37. The optic signals appearing at the output of the electro optic converter 38 are fed through a fiber optic medium 42 which is approximately ten feet long into the shielded environmental enclosure 30 to an optic electro converter 43. The optic electro converter 43 converts the signals back into electrical signals for transmitting the various command signals to the remote transient recorder control system 44 and, in turn, to the transient recorder 28. The remote transient recorder control system may be any suitable control system that provides signals responsive to command signals for activating the transient recorder for storing and transmitting information received. The recorder is operated in a mode such that after being armed it records continuously until triggered by a lightning produced transient. When such a transient occurs recording stops after a predetermined time. The memory of the recorder then contains data prior to, during and after the event. After completion of recording, data is sent to the remote computer for analysis. Data may be sent several times to preclude transmission errors. Data in memory is not destroyed until computer issues appropriate commands. Signals are also fed back from the transient recorder 28 through the remote transient recorder control system 44 and electro optic converter 46 which converts the electrical signals to optical signals for being fed back through a fiber optic medium 48 to the optic electro converter 40 carried outside of the environmental enclosure 30. The optic electro converter 40 converts the optical signals back to electrical signals for being transmitted over the telephone line 37 back to the computer 32.

Figure 4:
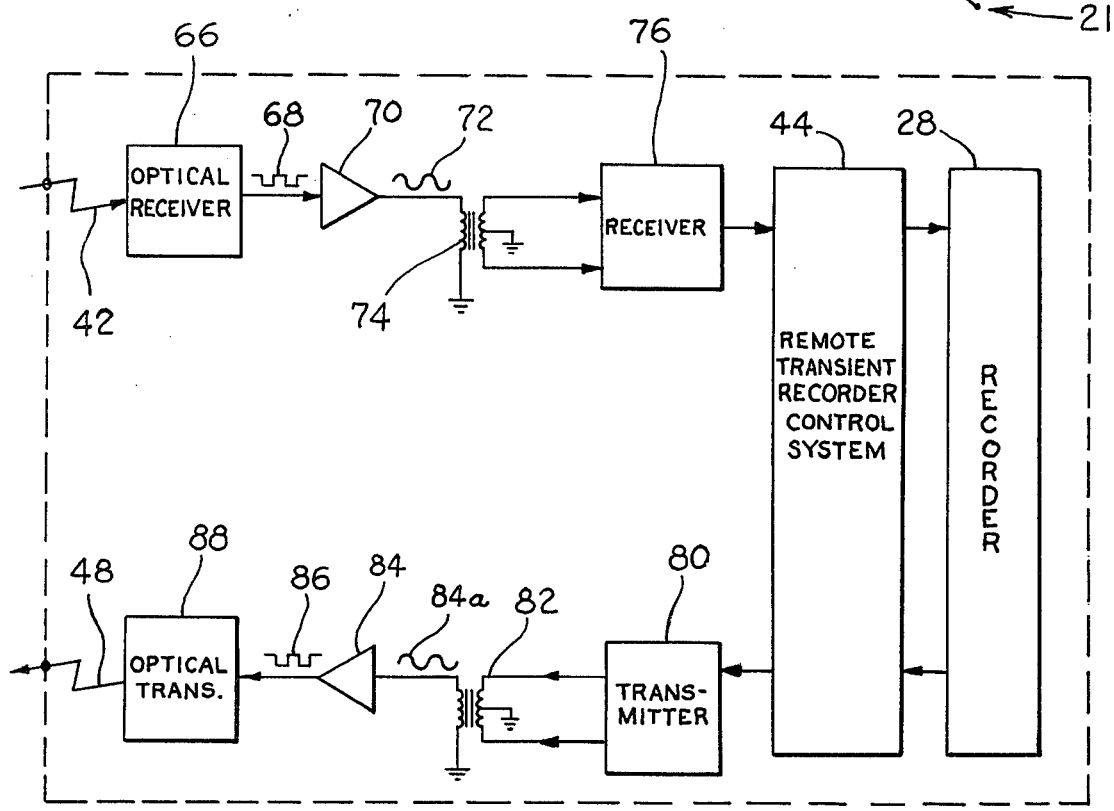
FIGS. 3 and 4 are a more detailed schematic showing of the device of FIG. 2.
Figure 3:
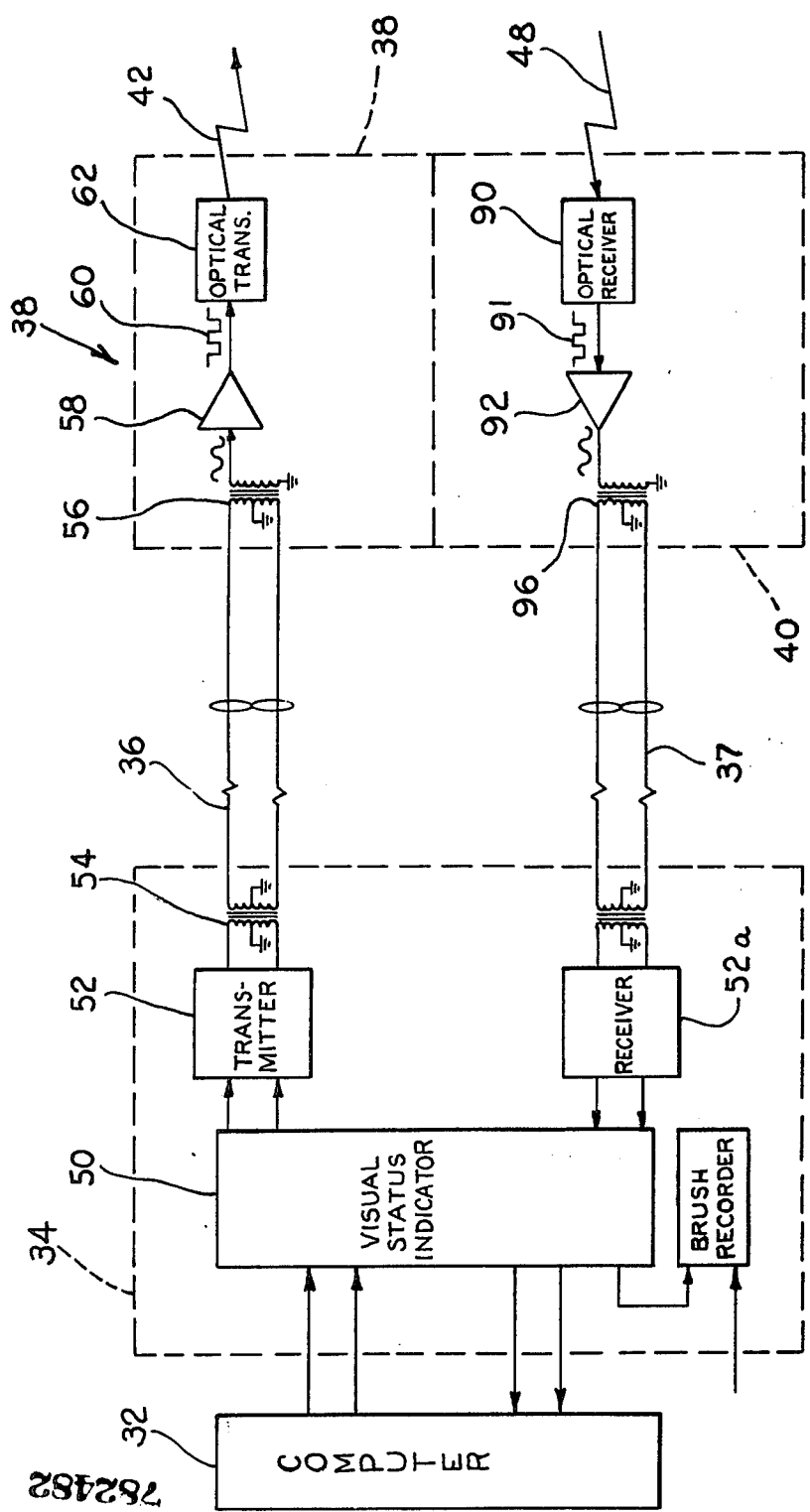

Referring in more detail to FIGS. 3 and 4 of the drawings, there is illustrated a more detailed schematic diagram of the lightning monitoring system.

The computer 32 forms part of the master control unit and transmits its command signals in parallel form in the form of a sixteen bit word, to a visual status indicator 50 which has lights provided thereon that turn on and off according to the command signal received from the computer 32. The signal are then fed to a transmitter module 52 in parallel form and the transmitter module 52 converts the parallel signals into serial form. The transmitter module 52 also frequency shift keys the information for transmission through a transformer 54, the telephone lines 36 to a receiver transformer 56. The output of the transformer 56 is connected through a wave shaping amplifier 58 which converts the frequency shift keyed signal into square waves such as indicated at 60. These square waves are, in turn, fed to an optical isolator transmitter 62 for producing light waves that are fed through a fiber optic medium 42 which corresponds to the electrical signal received. The fiber optic medium 42 extends into the environmental enclosure 30 through a very small hole.

The command signals are fed into an optical receiver 66 which converts the optical signals back into square wave electrical signals such as illustrated by reference character 68. As shown in FIG. 4, these square wave electrical signals are, in turn, fed through a bandpass amplifier 70 and are converted into a sinusoidal wave such as illustrated at 72. The sinusoidal wave is fed through an isolating transformer 74 into a serial to parallel receiver and converter 76 which converts the serial information back into parallel information. This parallel information is fed to the transient recorder 28 which may be any suitable transient recorder and one particular recorder is manufactured Biomation Corp. Cupertina, Calif. and is identified by Model No. 8100. This recorder stores in parallel digital form the voltage wave form produced by the lightning strikes being fed over the shielded cable 24 and through the attenuator 26.

The remote transient recorder control system 44 receives command signal from the optical receiver 66 and, in turn, sends command signals to the transient recorder 28. The command signals may arm the recorder so that it will record signals produced by a lightning strike. They may also enable the recorder to store the information and/or transmit the information back to the computer 32. The signals stored in the transient recorder are in binary form representing $dI/dT$ produced in the mass 17 by the lightning. The binary information is fed to the transmitter module 80 by means of the remote transient recorder control system 44 and is converted into a frequency shift keyed sinusoidal wave. This sinusoidal wave is fed back through an isolation transformer 82 to a wave shaping amplifier 84 which converts the signal 84a into a square wave signal 86. This square wave signal is, in turn, fed to optical transmitter 88 which converts the electrical signal back into an optical signal that is fed through the fiber optic medium 48 to the optical receiver 90. The optical receiver converts the optical signal back into an electrical signal as represented by 91 which is fed to a bandpass amplifier 92 whose output is coupled to a transformer 96 that is, in turn, connected to the transmission line 37 for being fed back to the computer 32. The binary information is then integrated to reconstruct the wave shape produced by the lightning strike.

The transient recorder is a conventional recorder so that after it has been armed by a signal from the computer 32 when a trigger occurs as a result of a lightning strike a flag signal will be generated and a continuous uninterruptable signal will be transmitted back to the computer to warn that a lightning strike has occurred.

By utilizing a transient recorder that can be remotely controlled through command signals for storing and transmitting information representing voltages produced by lightning strikes, the recorder may be placed within a shielded enclosure at the site being monitored. The feeding of the optical signals into the enclosure through the fiber optic medium electrically isolates the control system for the recorder as well as the recorder.

While a preferred embodiment of the invention has been described using specific terms, such description is for illustrative purposes only, and it is to be understood that changes and variations may be made without departing from the spirit or scope of the following claims.

What is claimed is:

1. An apparatus for monitoring lightning strikes comprising:
   (a) an electrically conductive elongated member located in the vicinity where said lightning strikes are to be monitored so that electrical currents are generated in said elongated member proportional to the intensity of said lightning strikes;
   (b) means for sensing the change in current flowing through said elongated member and generating a voltage responsive thereto;
   (c) an on-site transient recorder control system;
   (d) an on-site recorder means for converting said generated voltages to digital signals and storing said digital signals;
   (e) an radio frequency interference proof environmental housing enclosing said recorder means and said recorder control system;
   (f) a remotely located control means for generating electrical command signals for controlling storing and transmitting of said digitial signals in and from said recorder means;
   (g) cables extending between said remotely located control means and said housing;
   (h) an optical/electrical interface means interposed between said cables and said transient recorder control system for providing communication from outside said housing to said recorder control system located in said housing;
   (i) means for transmitting said command signals to said recorder control system and said transient recorder means causing said recorder means to record said digital information, and
   (j) means for transmitting information from said on site recorder means and said recorder control system to said remotely located control means representing the change in current produced by lightning strikes;

whereby by enclosing said recorder control system and said recorder means within said housing and providing communication therewith from said control means through said optical electrical interface electrical isolation therebetween is provided.

2. The apparatus as set forth in claim 1 wherein said optical/electrical interface means includes a fiber optic cable which extends from said cables outside of said housing to said recorder control means inside said housing.

3. The apparatus as set forth in claim 1 wherein said electrical conductive elongated member is an elongated cable in which current is generated responsive to lightning strikes.

4. The apparatus as set forth in claim 1 wherein said means for sensing the change in current flowing through said elongated member includes a coil surrounding said elongated member which generates a voltage responsive to changes in current in said elongated member.

5. The apparatus as set forth in claim 2 further comprising;
   (a) an electro-optic converter connected to one end of said fiber optic cable for converting said electrical command signals to optical signals, and
   (b) an optic electro converter connected to said other end of said fiber optic cable for converting said optical signals back to electrical signals.

6. An apparatus for monitoring lightning strikes comprising:
   (a) an electrically conductive elongated member located in the vicinity where said lightning strikes are to be monitored so that electrical currents are generated in said elongated member proportional to the intensity of said lightning strikes;
   (b) means for sensing the change in current flowing through said elongated member and generating a voltage responsive thereto;
   (c) an on-site recorder means for converting said generated voltages to digital signals and storing said digital signals;
   (d) an radio frequency interference proof environmental housing enclosing said recorder means;
   (e) a remotely located control means for generating electrical command signals for controlling storing and transmitting of said digital signals in and from said recorder means;
   (f) an electrical cable extending between said remotely located control means and said housing;
   (g) an electro-optic converter connected to one end of said electrical cable for converting said electrical command signals to optical signals;
   (h) a fiber optic cable extending from said electro-optic converter into said housing for transmitting said optical signals into said housing;

(i) an optic-electro converter located in said housing and being connected to said fiber-optic cable for converting said optical signals back to electrical signals.
(j) means for connecting said optic-electro converter to said recorder means for supplying said electrical signals thereto;

whereby said recorder is isolated by said housing and said fiber optic cable from external electrical interference.

* * * * *